(12) United States Patent
Oakes et al.

(10) Patent No.: US 8,467,169 B2
(45) Date of Patent: Jun. 18, 2013

(54) CAPACITORS ADAPTED FOR ACOUSTIC RESONANCE CANCELLATION

(75) Inventors: James Oakes, Nashua, NH (US); James Martin, Londonderry, NC (US); Andrey Kozyrev, St. Petersburg (RU); Alexandr Prudan, St. Petersburg (RU)

(73) Assignee: Research In Motion RF, Inc., Wilmington, DE (US)

( * ) Notice: Subject to any disclaimer, the term of this patent is extended or adjusted under 35 U.S.C. 154(b) by 0 days.

(21) Appl. No.: 11/890,901

(22) Filed: Aug. 8, 2007

(65) Prior Publication Data

US 2009/0040687 A1    Feb. 12, 2009

Related U.S. Application Data

(63) Continuation of application No. 11/726,458, filed on Mar. 22, 2007, now Pat. No. 7,936,553.

(51) Int. Cl.
*H01G 7/00* (2006.01)
*H01G 7/06* (2006.01)
*H01G 5/00* (2006.01)

(52) U.S. Cl.
USPC ......................................... 361/281; 361/277

(58) Field of Classification Search
USPC ..................... 361/311, 280, 281, 277, 278
See application file for complete search history.

(56) References Cited

U.S. PATENT DOCUMENTS

| | | | |
|---|---|---|---|
| 3,683,211 A * | 8/1972 | Perlman et al. | 310/326 |
| 4,240,003 A | 12/1980 | Larson, III | 310/326 |
| 4,307,356 A | 12/1981 | Arai | |
| 4,491,697 A | 1/1985 | Tanaka et al. | |
| 5,032,805 A * | 7/1991 | Elmer et al. | 333/156 |
| 5,472,935 A | 12/1995 | Yandrofski | |
| 5,640,042 A | 6/1997 | Koscica | |
| 5,729,239 A * | 3/1998 | Rao | 343/753 |
| 5,745,335 A | 4/1998 | Watt | 361/313 |
| 5,771,148 A * | 6/1998 | Davis | 361/281 |
| 5,825,117 A * | 10/1998 | Ossmann et al. | 310/317 |
| 5,846,893 A | 12/1998 | Sengupta | |
| 6,121,649 A | 9/2000 | Kunishima | |
| 6,304,425 B1 * | 10/2001 | Mamada | 361/321.2 |
| 6,362,500 B2 | 3/2002 | Ishiwara | |
| 6,377,142 B1 * | 4/2002 | Chiu et al. | 333/238 |
| 6,377,217 B1 | 4/2002 | Zhu et al. | 343/700 MS |

(Continued)

FOREIGN PATENT DOCUMENTS

| | | |
|---|---|---|
| EP | 1 408 537 A2 | 4/2004 |
| JP | 03234317 A * | 10/1991 |
| JP | 8055752 | 2/1996 |

OTHER PUBLICATIONS

International Search Report dated Oct. 6, 2008 for PCT application serial No. PCT/US2008/004919.

(Continued)

*Primary Examiner* — David M Sinclair
(74) *Attorney, Agent, or Firm* — Guntin & Gust, PLC; Andrew Gust

(57) ABSTRACT

An embodiment of the present disclosure provides a method to reduce acoustic vibration in a multilayered capacitor stimulated by a radio frequency signal by placing a first capacitor layer adjacent to second capacitor layer sharing a common electrode such that the acoustic vibration is reduced by applying one or more anti-acoustic vibration bias voltages to the multilayered capacitor. Other embodiments are disclosed.

12 Claims, 4 Drawing Sheets

U.S. PATENT DOCUMENTS

| | | |
|---|---|---|
| 6,377,440 B1 | 4/2002 | Zhu et al. ............... 361/311 |
| 6,404,614 B1 | 6/2002 | Zhu et al. ............... 361/277 |
| 6,437,484 B1 | 8/2002 | Nishimura et al. ........ 310/324 |
| 6,492,883 B2 | 12/2002 | Liang et al. ............. 333/132 |
| 6,514,895 B1 | 2/2003 | Chiu et al. .............. 501/137 |
| 6,525,630 B1 | 2/2003 | Zhu et al. ............... 333/205 |
| 6,531,936 B1 | 3/2003 | Chiu et al. .............. 333/164 |
| 6,556,102 B1 | 4/2003 | Sengupta et al. .......... 333/161 |
| 6,597,265 B2 | 7/2003 | Liang et al. ............. 333/204 |
| 6,603,367 B2 | 8/2003 | Pao et al. ............... 331/177 V |
| 6,617,062 B2 | 9/2003 | Chang .................... 428/701 |
| 6,621,377 B2 | 9/2003 | Osadchy et al. ........... 333/161 |
| 6,646,522 B1 | 11/2003 | Kozyrev et al. ........... 333/161 |
| 6,653,912 B2 | 11/2003 | Robinson et al. .......... 333/132 |
| 6,674,321 B1 | 1/2004 | York ..................... 327/586 |
| 6,683,513 B2 | 1/2004 | Shamsaifar et al. ........ 333/135 |
| 6,683,516 B2 | 1/2004 | Chiu et al. .............. 333/231 |
| 6,683,517 B2 | 1/2004 | Chiu et al. .............. 333/243 |
| 6,686,814 B2 | 2/2004 | Chiu et al. .............. 333/164 |
| 6,686,817 B2 | 2/2004 | Zhu et al. ............... 333/205 |
| 6,710,679 B2 | 3/2004 | Zhu ...................... 333/164 |
| 6,717,491 B2 | 4/2004 | Liang et al. ............. 333/205 |
| 6,724,280 B2 | 4/2004 | Shamsaifar et al. ........ 333/209 |
| 6,727,535 B1 | 4/2004 | Sengupta et al. .......... 257/295 |
| 6,737,179 B2 | 5/2004 | Sengupta ................. 428/702 |
| 6,774,077 B2 | 8/2004 | Sengupta et al. .......... 501/137 |
| 6,794,262 B2 | 9/2004 | Ning et al. |
| 6,794,960 B2 | 9/2004 | Chiu et al. .............. 333/239 |
| 6,801,102 B2 | 10/2004 | Shamsaifar et al. ........ 333/174 |
| 6,801,104 B2 | 10/2004 | Zhu et al. ............... 361/311 |
| 6,836,055 B2 | 12/2004 | Sasaki |
| 6,860,954 B2 | 3/2005 | Mamada |
| 6,864,840 B2 | 3/2005 | Zhu et al. ............... 343/700 MS |
| 6,864,843 B2 | 3/2005 | du Toit et al. ........... 343/700 MS |
| 6,876,279 B2 | 4/2005 | Sengupta et al. .......... 333/238 |
| 6,903,633 B2 | 6/2005 | Zhu et al. ............... 333/207 |
| 6,905,989 B2 | 6/2005 | Ellis et al. ............. 501/32 |
| 6,949,982 B2 | 9/2005 | Du Toit .................. 331/107 SL |
| 6,954,118 B2 | 10/2005 | Kozyrev et al. ........... 333/161 |
| 6,960,546 B2 | 11/2005 | Caspers et al. ........... 501/135 |
| 6,967,540 B2 | 11/2005 | du Toit .................. 331/107 SL |
| 6,975,500 B2 * | 12/2005 | Hunt et al. .............. 361/306.3 |
| 6,987,493 B2 | 1/2006 | Chen ..................... 343/893 |
| 6,995,969 B2 | 2/2006 | Araki |
| 7,034,636 B2 | 4/2006 | Shamsaifar et al. ........ 333/174 |
| 7,042,316 B2 | 5/2006 | Shamsaifar et al. ........ 333/209 |
| 7,056,468 B2 | 6/2006 | Chiu et al. .............. 264/650 |
| 7,109,818 B2 | 9/2006 | Rivkina |
| 7,109,825 B2 | 9/2006 | Song |
| 7,224,040 B2 | 5/2007 | Koutsaroff et al. ........ 257/535 |
| 7,561,010 B2 | 7/2009 | Hikita |
| 7,808,765 B2 | 10/2010 | Zhang |
| 7,812,692 B2 | 10/2010 | Ayazi |
| 2004/0196620 A1 * | 10/2004 | Knudsen et al. ........... 361/311 |
| 2005/0068219 A1 | 3/2005 | Kobayashi et al. |
| 2006/0274476 A1 | 12/2006 | Cervin-Lawry et al. |
| 2007/0007853 A1 | 1/2007 | Toit et al. |
| 2007/0007854 A1 | 1/2007 | Oakes et al. |
| 2007/0242410 A1 * | 10/2007 | Leeper ................... 361/277 |
| 2008/0232023 A1 * | 9/2008 | Oakes et al. ............. 361/280 |

OTHER PUBLICATIONS

International Search Report dated Aug. 27, 2008 for PCT application serial No. PCT/US2008/004935.

* cited by examiner

CAPACITORS ADAPTED FOR ACOUSTIC RESONANCE CANCELLATION

CROSS-REFERENCE TO RELATED APPLICATION

This application is a continuation of patent application Ser. No. 11/726,458 now U.S. Pat. No. 7,936,553, entitled, "CAPACITORS ADAPTED FOR ACOUSTIC RESONANCE CANCELLATION" filed Mar. 22, 2007, by Oakes et al.

BACKGROUND OF THE INVENTION

Varactors are voltage tunable capacitors in which the capacitance is dependent on a voltage applied thereto. Although not limited in this respect, this property has applications in electrically tuning radio frequency (RF) circuits, such as filters, phase shifters, and so on. The most commonly used varactor is a semiconductor diode varactor, which has the advantages of high tunability and low tuning voltage, but suffers low Q, low power handling capability, high nonlinearity and limited capacitance range. A new type of varactor is a ferroelectric varactor in which the capacitance is tuned by varying the dielectric constant of a ferroelectric material by changing the bias voltage. Ferroelectric varactors have high Q, high power handling capacity, good linearity and high capacitance range.

The use of barium titanate, strontium titanate, or barium strontium titanate (BST) of any composition including any doped BST formulation to make tunable capacitors relies on the dielectric properties of the ferroelectric material in the paraelectric phase. This means the dielectric constant of the material changes under the applied electric field. As a capacitor, the capacitance at zero bias is a maximum and the capacitance drops with applied voltage as illustrated in FIG. 1 at 100 in capacitance 110 vs. volts 120. This change in capacitance allows these units to be used to create tunable circuits in filters, matching networks, resonant circuits and other applications at frequencies from audio to RF and microwave.

The cross section of a typical capacitor consists of two (or more) conductive plates or electrodes with one or more layers of tunable dielectric material such as BST between them. The dielectric constant of the tunable material determines the capacitance as $C=\in A/d$, where $\in$ is the dielectric constant of the tunable material, A is the area of the electrodes and d is the separation of the electrodes and thickness of the tunable material. A DC voltage is applied to the electrodes to induce an electric field in the tunable dielectric.

Since $\in$ of the tunable material is a function of the electric field which is E=V/d, then V=Ed and thus the capacitance is a function of voltage. However, ferroelectric materials are also electrostrictive. As an electric field is applied, which lowers the dielectric constant, the piezoelectric constant of the material becomes non-zero. As a result, the electric field is converted into a physical change of the lattice constants of the film. Simultaneous application of an AC signal to the material causes acoustic vibrations of atoms in the crystalline lattice and is called electromechanical coupling. Therefore any AC signal on the tunable capacitor under bias produces an acoustic response. At certain frequencies, determined by the layer thicknesses and materials in the capacitor stack, the acoustic response of the structure will be resonant and the loss of the capacitor will increase as energy is lost from the AC electrical signal into acoustic vibrations.

This effect manifests itself as regions or frequencies where capacitors exhibit high losses. Much design effort must be used to choose the layer materials and their thicknesses to minimize or eliminate the acoustic losses at the desired frequencies of operation; however, it may be impossible to completely eliminate the losses within the desired frequency band(s) because of conflicting performance requirements for the device. This effect manifests over a wide range of frequencies up to many Gigahertz—which is the usual range of frequencies used by applications for these devices.

To illustrate this effect, an example of the frequency response of the Q-factor of a tunable capacitor from 100 MHz to 3 GHz is shown on FIG. 2, generally as 200 [Q is a measure of the loss of the capacitor defined as $Q=Xc/Rs$ where $Xc=1/\omega C$ and Rs is the series resistance].

At zero applied voltage 205, there is no generation of acoustic vibrations by the tunable material and the Q versus frequency is relatively smooth from 100 MHz to 3 GHz and rolls off from about 180 down to 35.

At 30 volts applied voltage 215, this capacitor was designed to avoid acoustic loss effects up to about 1 GHz and the response is again fairly smooth and flat dropping from about 150 to 70. Above 1 GHz, however, the response is no longer flat and the Q drops well below the Q at zero bias. The center frequency of the major resonances due to the acoustic coupling are noted on the chart at about 1.5 GHz (220), 1.7 GHz (225), 1.85 GHz (230) and 2.8 GHz (235). These resonances prevent the capacitor from being used in those frequency ranges.

Thus, there is a strong need for voltage tunable capacitors adapted to reduce acoustic losses and improve Q.

SUMMARY OF THE INVENTION

An embodiment of the present invention provides a device, comprising a multilayered tunable dielectric capacitor, wherein the multilayers of tunable dielectric are adapted to be DC biased to reduce the dielectric constant; and wherein the DC bias is arranged so that the number of layers of tunable dielectric biased positively is equal to the number of layers of tunable dielectric biased negatively.

An embodiment of the invention further provides a method, comprising reducing the losses due to electro-mechanical coupling and improving Q in a multilayered capacitor by placing a first capacitor layer adjacent at least one additional capacitor layer and sharing a common electrode in between the two such that the acoustic vibration of the first layer is coupled to an anti-phase acoustic vibration of the at least one additional layer.

Still another embodiment of the present invention provides a multilayered tunable capacitor, comprising a first voltage tunable dielectric layer, at least one additional voltage tunable dielectric layer adjacent to the first voltage tunable dielectric layer and sharing a common electrode in between the two, and wherein any acoustic vibration of the first voltage tunable dielectric layer caused by the application of combined AC and DC voltages is coupled to a corresponding acoustic vibration caused by the application of the combined AC and DC voltages to the at least one additional voltage tunable dielectric layer, thereby reducing acoustic losses and improving Q.

Yet another embodiment of the present invention provides, a device, comprising a single layered varactor consisting of at least two capacitors connected in series to an RF signal and adapted to reduce acoustic losses and improve Q. The adjacent electrodes of the at least two capacitors may be positioned to vibrate in opposite phases thereby reducing acoustic losses and improving Q. Further, a DC bias may be applied across the at least two capacitors from a top to a bottom electrode.

Yet another embodiment of the present invention provides a method, comprising reducing the acoustic losses and improving Q in a single layered varactor by connecting at least two capacitors in series to an RF signal so that adjacent electrodes of the at least two capacitors vibrate in opposite phase. In the present method, the DC bias may be applied across the at least two capacitors from a top to a bottom electrode and the at least two capacitors may produce acoustic waves of the opposite phase which cancel and wherein by placing a first capacitor adjacent to at least one additional capacitor, the acoustic wave of the first capacitor may be coupled to and cancel an opposite phase acoustic wave of the at least one additional capacitor.

Still another embodiment of the present invention provides a device, comprising at least two capacitors connected in series to an RF signal and adapted to reduce acoustic losses and improve Q, wherein adjacent electrodes of the at least two capacitors may be positioned to have maximal interimposing of acoustic vibrations with opposite phases thereby reducing acoustic losses and improving Q. The DC bias may be applied across the at least two capacitors in opposite directions.

Yet another embodiment of the present invention provides a tunable capacitor, comprising a plurality of voltage tunable dielectric layers acoustically coupled together and sharing a common conductive electrode between adjacent the tunable dielectric layers, a plurality of outer conductive electrodes on the outer surfaces of the tunable dielectric layers forming a plurality of acoustically-coupled capacitors, and an applied DC bias on each of the capacitors such that the number of positively-biased capacitors equals the number of negatively-biased capacitors. The present device may further comprise an applied RF signal between the top and bottom electrodes.

Lastly, an embodiment of the present invention may provide a tunable capacitor, comprising multiple single-layer capacitors connected in series to an RF signal, wherein the single-layer capacitors are in close lateral physical proximity and are acoustically coupled together and wherein a DC bias is capable of being applied to each capacitor such that the electric fields on equal numbers of the single-layer capacitors are in opposite directions.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 1:
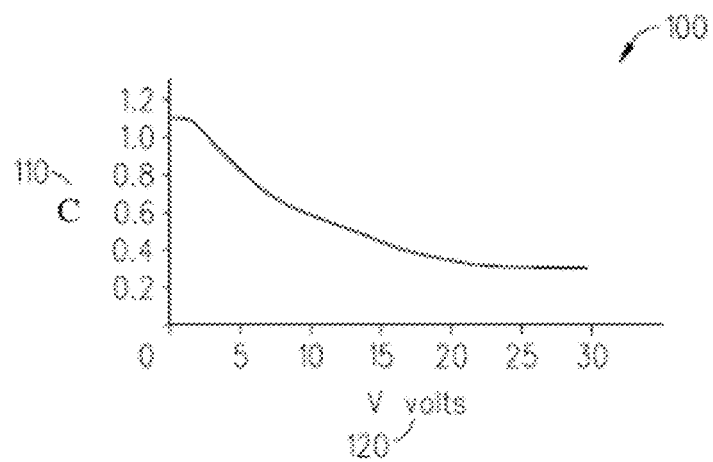
FIG. 1 illustrates a typical C-V tuning curve of a voltage tunable dielectric capacitor.
Figure 2:
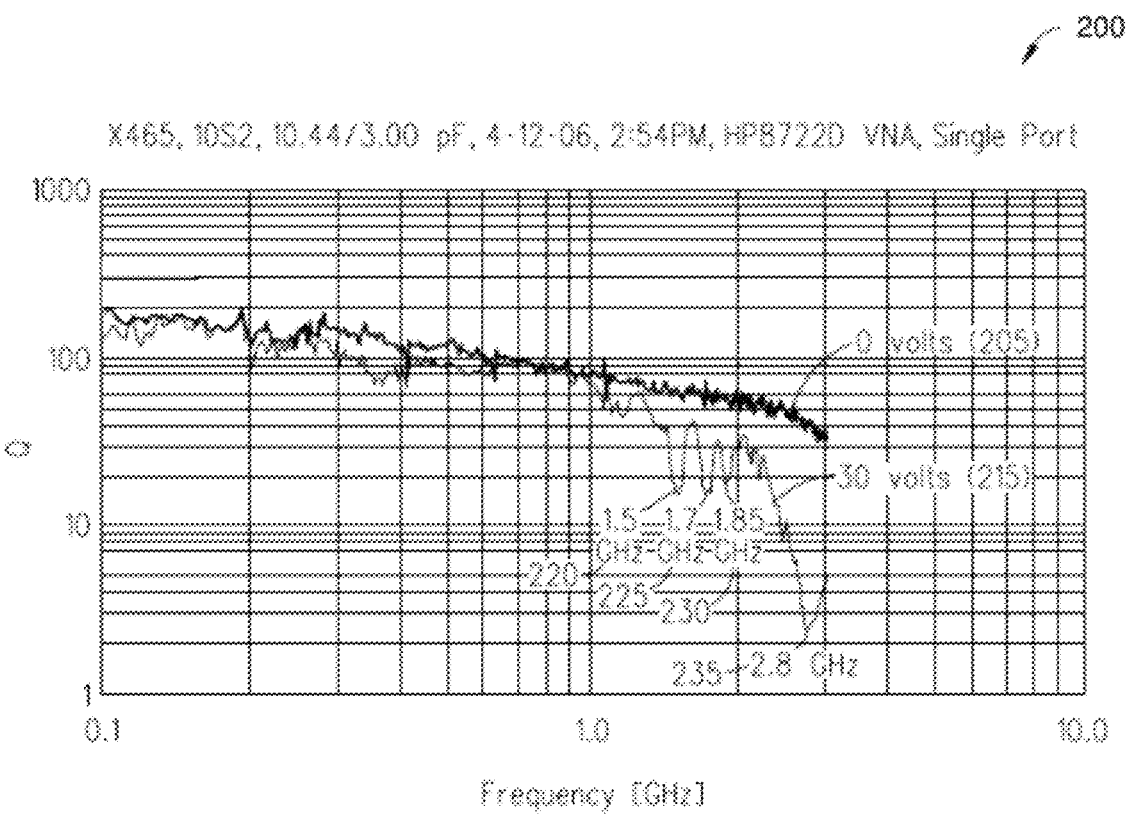
FIG. 2 graphically depicts frequency vs. Q of a typical voltage tunable capacitor at zero and 30 volts from 100 MHz to 3 GHz with losses due to acoustic vibration noted for 30 volts at 1.5, 1.7, 1.85 and 2.8 Ghz.
Figure 3:
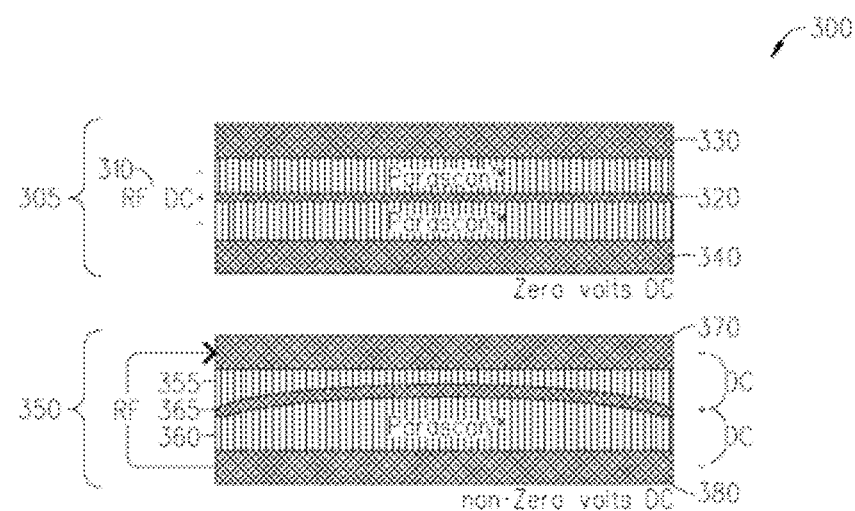
FIG. 3 illustrates a multilayered voltage tunable dielectric capacitor according to one embodiment of the present invention.

An embodiment of the present invention provides a two layer capacitor in which the two layers produce acoustic vibrations of the opposite phase which cancel—although it is understood that the present invention is not limited to two layers. By placing one capacitor in intimate physical contact with the other and sharing a common electrode in between the two, the acoustic vibration of one capacitor is coupled to acoustic vibrations of the other. It is understood that the layers being adjacent in any arrangement is intended to be within the scope of the present invention. The structure is illustrated in FIG. 3, generally as 300.

In operation, in an embodiment of the present invention, a DC voltage 310 may be applied from the center electrode 320 to the outer 2 electrodes 330 and 340. The DC 310 can be either positive or negative, but it is illustrated as positive. As any RF (or AC signal of any frequency) signal may be applied between the two outer (top and bottom or side to side) electrodes of the two capacitors, the RF adds to the DC on one capacitor and subtracts on the other. As shown in the FIG. 3 at 305, with zero DC, the two capacitors have no acoustic vibration and no acoustic loss. But as shown in FIG. 3, 350, the addition of DC bias causes the two tunable layers 355 and 360 to acoustically vibrate in time to the RF signal and the center electrode 365 will vibrate while the outside electrodes are relatively still, depending on the density and thickness of the three metal electrodes. This is illustrated by the curved shape of the center electrode 365 representing the physical displacement at a moment in time. This means that the tunable layers are not, (to first order), transmitting acoustic energy to the outer layers 370 and 380 of the capacitor and subsequently into the rest of the surrounding layer with their resonances causing extra losses. There may be still vibrations within the two tunable layers 355 and 360 and this will incur some loss.

The result is that the two-layer (or multi-layer) structure should greatly reduce the acoustic losses caused by acoustic resonance with the surrounding layer structure. In addition, since the center layer of metal 365 is not carrying RF signals along its length, but only through it from the bottom tunable layer 360 to the top tunable layer 355, its resistivity can be much higher than the outside metal contacts which must support lateral conduction at low loss. This opens up the choice of middle electrode materials to metals, metal oxides or other conductive materials which may benefit the performance of the device and withstand the processing of the capacitor stack.

Figure 4A:
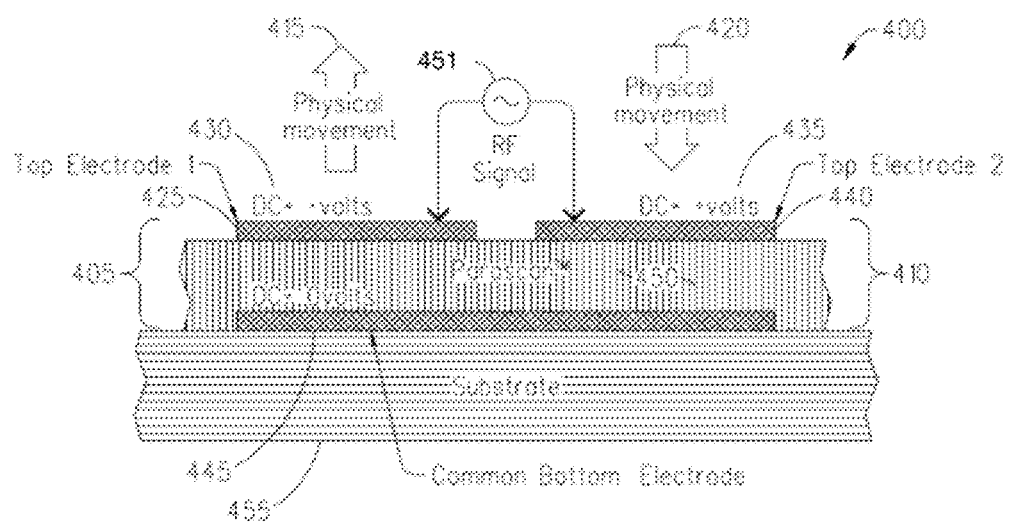
FIGS. 4a and 4b illustrate the configuration of a single-layered voltage tunable dielectric capacitor of one embodiment of the present invention.
Figure 4B:
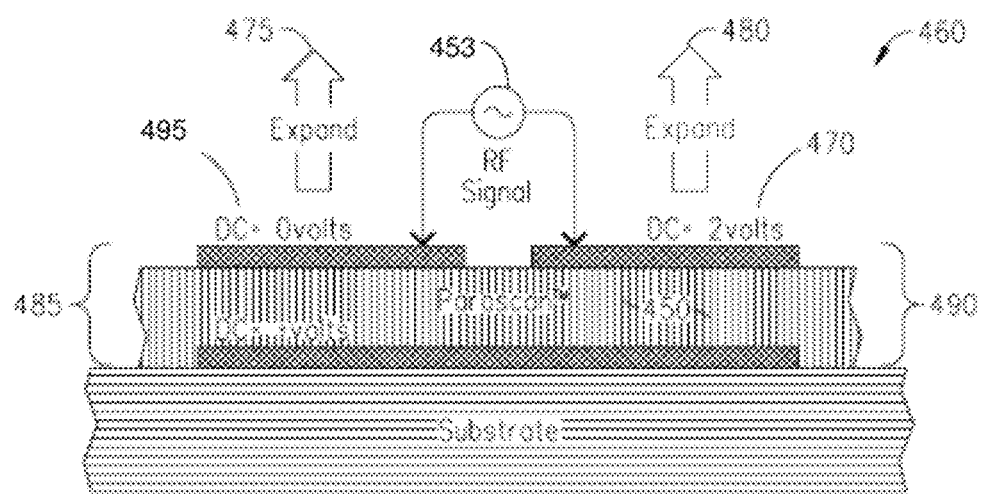

Turning now to embodiment 400 of FIG. 4a and embodiment 460 of FIG. 4b, is an illustration of the configuration of a single-layered voltage tunable dielectric capacitor consisting of two capacitors connected in series to the RF signal according to one embodiment of the present invention and illustrating the opposite direction of movement of the adjacent electrodes (FIG. 4a) and the same direction of movement of the adjacent electrodes (FIG. 4b) due to the vibration of the electrodes when the same DC bias is applied across both capacitors from top to bottom electrode (FIG. 4a) and when DC bias is applied from the top electrode of the left capacitor to the bottom electrode and then to the top electrode of the right capacitor.

The original observation of the effect of bias direction on the Q response of capacitors 405 and 410 was physical movement 415 of capacitor 1 (405) with DC=+volts 430 applied to top electrode 425 relative to DC=0 volts at common bottom electrode 445; and physical movement 420 of capacitor 2 (410) with DC=+volts 435 applied to top electrode 440 relative to DC=0 volts at common electrode 445, which led to an even-numbered (such as 2) multilayer structure, was when biasing two capacitors 405 and 410 sitting side by side in close proximity. The two capacitors 405 and 410 are biased such that one will be vibrating in one phase while the other is vibrating in the opposite phase because of the RF 451 and DC bias 430 and 435 polarities as shown in FIG. 4a. Sandwiched between both top electrodes 425 and 440 and bottom electrode 445 is a tunable dielectric material 450 such as Parascan® voltage tunable dielectric material or any other ferroelectric material (including those in paraelectric state), which may be placed above substrate 455.

As shown in FIG. 4b, when the DC voltages 495 and 470 were changed to bias one capacitor 485 from +V to 0 volts and the other 490 from +V to +2 V, both capacitors vibrate together in phase. The physical movement 475 of capacitor 485 is in phase or additive to the physical movement 480 of capacitor 490.

Figure 5:
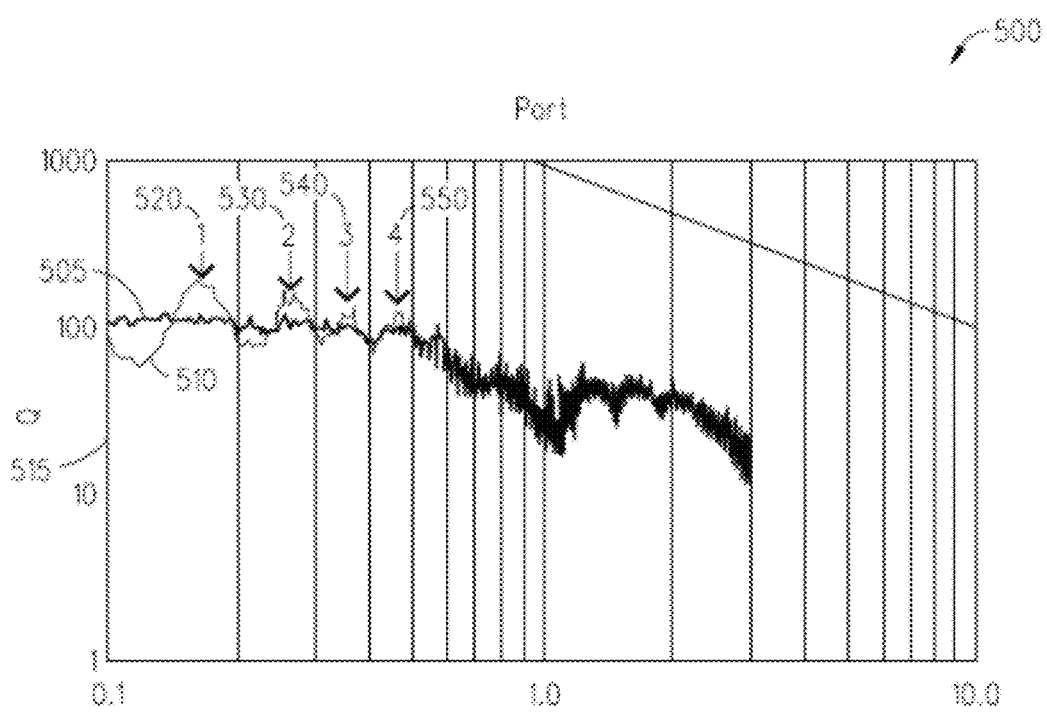
FIG. 5 illustrates the Q vs. frequency from 100 MHz to 3 GHz of the two bias configurations of adjacent single layer capacitors of FIG. 4 of one embodiment of the present invention.

Turning now to FIG. 5 at 500, the measured results show the out of phase bias condition 505 and in phase bias condition 510, and the measured Q 515. Note the response peaks labeled 1 (520), 2 (530), 3 (540) and 4 (550) which now appear when the two capacitors' acoustic response is in phase. These indicate the close proximity of the two capacitors allows the acoustic movement to cancel with the normal 15 volt bias but add when biased in phase.

Figure 6:
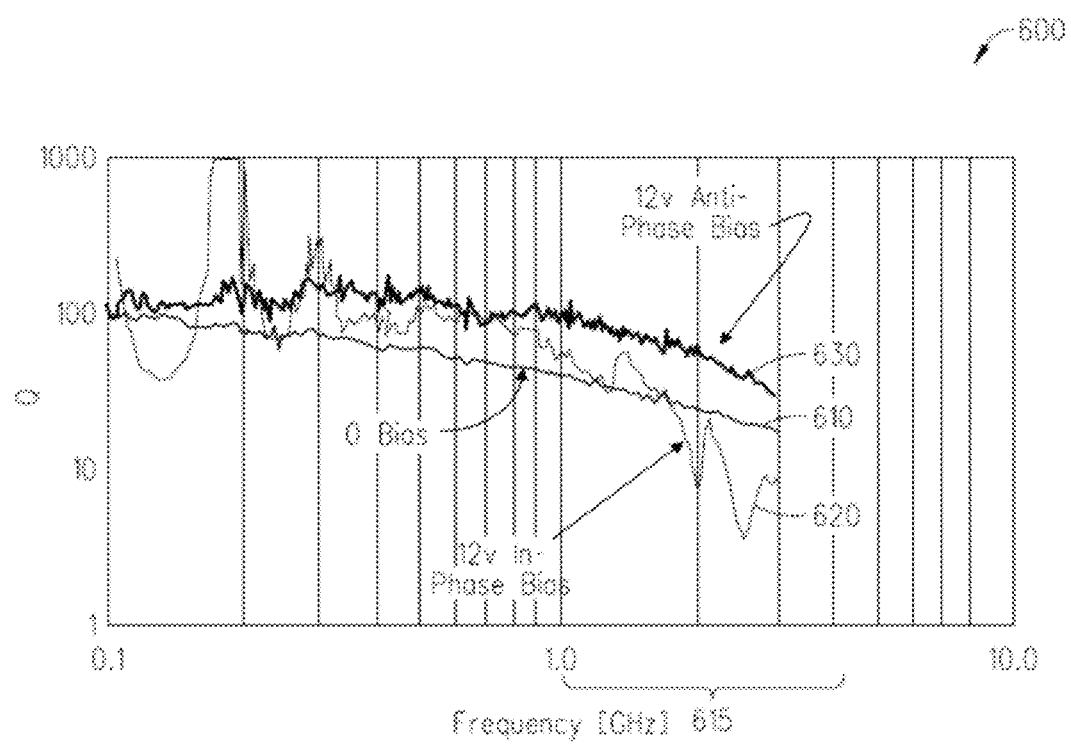
FIG. 6 graphically illustrates Q vs. DC bias when in phase and out of phase of one multi-layer embodiment of the present invention.

As graphically depicted in FIG. 6 at 600, in an embodiment of the present invention, measurements of a 2-layer capacitor confirmed the expected acoustic cancellation. The curve 610 at zero bias shows no acoustic resonances. The curve at 620, which depicts the measurement with the two caps biased in phase, shows very substantial acoustic resonance and loss from 100 MHz to 3 GHz (615) including significant peaks or valleys at about 180 MHz, 300 MHz, 1.4 GHz, 2 GHz and 2.5 GHz. The curve 630 for anti-phase bias has removed all major peaks from the response and is well behaved from 100 MHz to 3 GHz (615). (The two measured curves, 610 and 620, are measured on the same device just with different bias directions).

Thus, to reiterate, the acoustic loss can be influenced by the phase of the acoustic vibrations in adjacent or acoustically-coupled layers of materials. Further, acoustic cancellation may eliminate resonances and loss when two layers of tunable material are placed on top of each other and biased for anti-phase response. Again, although the present embodiment of the present invention describes a two layer embodiment, any number of layers and, more preferably, any equal number of tunable dielectric layers with opposite DC bias should produce cancellation.

The cancellation may not eliminate all acoustic loss or at all frequencies as the tunable dielectric material and the center electrode layer may still vibrate and generate losses, although at reduced levels at most frequencies. The two layer structure allows the resistivity requirements of the center layer to be relaxed and a wider range of materials may be used. Different materials in the center conductor will change the frequency and extent of the intrinsic loss of the two-layer structure allowing the device to be adapted for different frequency bands of operation.

Throughout the aforementioned description, BST can be used as a tunable dielectric material that may be used in a tunable capacitor of the present invention. However, the assignees of the present invention, Paratek Microwave, Inc. and Gennum Corporation have developed and continue to develop other tunable dielectric materials that may be utilized in embodiments of the present invention and thus the present invention is not limited to using BST material. One family of tunable dielectric materials may be referred to as Parascan®.

The term Parascan® as used herein is a trademarked term indicating a tunable dielectric material developed by Paratek Microwave Inc. Parascan® tunable dielectric materials have been described in several patents. Barium strontium titanate (BaTiO3-SrTiO3), also referred to as BSTO or BST, is used for its high dielectric constant (200-6,000) and large change in dielectric constant with applied voltage (25-75 percent with a field of 2 Volts/micron). Tunable dielectric materials including barium strontium titanate are disclosed in U.S. Pat. No. 5,312,790 to Sengupta, et al. entitled "Ceramic Ferroelectric Material"; U.S. Pat. No. 5,427,988 by Sengupta, et al. entitled "Ceramic Ferroelectric Composite Material-BSTO—MgO"; U.S. Pat. No. 5,486,491 to Sengupta, et al. entitled "Ceramic Ferroelectric Composite Material -BSTO—ZrO2"; U.S. Pat. No. 5,635,434 by Sengupta, et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO—ZnO"; U.S. Pat. No. 6,074,971 by Chiu et al. entitled "Ceramic Ferroelectric Composite Materials with Enhanced Electronic Properties BSTO Mg Based Compound-Rare Earth Oxide". These patents are incorporated herein by reference. The materials shown in these patents, especially BSTO—MgO composites, show low dielectric loss and high tunability. Tunability is defined as the fractional change in the dielectric constant with applied voltage.

Barium strontium titanate of the formula $Ba_xSr_{1-x}TiO3$ is a preferred electronically tunable dielectric material due to its favorable tuning characteristics, low Curie temperatures and low microwave loss properties. In the formula BaxSr1-xTiO3, x can be any value from 0 to 1, preferably from about 0.15 to about 0.6. More preferably, x is from 0.3 to 0.6.

Other electrically tunable dielectric materials may be used partially or entirely in place of barium strontium titanate. An example is $(Ba_xCa_{1-x})TiO_3$. Additional electronically tunable ferroelectrics include any electrically tunable compositions of perovskites such as, $NaNO_3$, $KNbO_3$, $BaTiO_3$, $SrTiO_3$, $CaTiO_3$, members of the lead titanate family such as $PbTiO_3$, $Pb(Zr_xTi_{1-x})O_3$ (PZT), $(Pb,Sr)(Zr_xTi_{1-x})O_3$, $(Pb,La)(Zr_xT_{1-x})O_3$ (PLZT), niobate-tantalate family such as $LiTaO_3$, $PbNb_2O_6$, $KSr(NbO_3)$, $LiNbO_3$, $K(Ta_{1-x}Nb_x)O_3$, $PbTa_2O_6$ KDP ($KH_2PO_4$) layered perovskites/Aurivillius phases such as $SrBi_2Ta_2O_9$ (SBT), tungsten-bronze structures ($PbTa_2O_6$), phosphates such as $KH_2PO_4$ (KDP), fluorides such as $BaMgF_4$ and mixtures and compositions thereof. Also, these materials can be combined with low loss dielectric materials, such as magnesium oxide (MgO), aluminum oxide ($Al_2O_3$), and zirconium oxide ($ZrO_2$), and/or with additional doping elements, such as manganese (Mn), iron (Fe), and tungsten (W), or with other alkali earth metal oxides (i.e. calcium oxide, etc.), transition metal oxides, silicates, niobates, tantalates, aluminates, zirconates, nitrides and titanates to further reduce the dielectric loss.

In addition, the following U.S. patents and patent Applications, assigned to the assignee of this application, disclose additional examples of tunable dielectric materials: U.S. Pat. No. 6,514,895, entitled "Electronically Tunable Ceramic Materials Including Tunable Dielectric and Metal Silicate Phases"; U.S. Pat. No. 6,774,077, entitled "Electronically Tunable, Low-Loss Ceramic Materials Including a Tunable Dielectric Phase and Multiple Metal Oxide Phases"; U.S. Pat. No. 6,737,179 filed Jun. 15, 2001, entitled "Electronically Tunable Dielectric Composite Thick Films And Methods Of Making Same; U.S. Pat. No. 6,617,062 entitled "Strain-Relieved Tunable Dielectric Thin Films"; U.S. Pat. No. 6,905,989, filed Apr. 31, 2002, entitled "Tunable Dielectric Compositions Including Low Loss Glass"; U.S. patent application Ser. No. 10/991,924, filed Nov. 18, 2004, entitled "Tunable Low Loss Material Compositions and Methods of Manufacture and Use Therefore" These patents and patent applications are incorporated herein by reference.

The tunable dielectric materials can also be combined with one or more non-tunable dielectric materials. The non-tunable phase(s) may include MgO, $MgAl_2O_4$, $MgTiO_3$, $Mg_2SiO_4$, $CaSiO_3$, $MgSrZrTiO_6$, $CaTiO_3$, $Al_2O_3$, $SiO_2$ and/or other metal silicates such as $BaSiO_3$ and $SrSiO_3$. The non-tunable dielectric phases may be any combination of the above, e.g., MgO combined with MgTiO3, MgO combined with $MgSrZrTiO_6$, MgO combined with $Mg_2SiO_4$, MgO combined with $Mg_2SiO_4$, $Mg_2SiO_4$ combined with $CaTiO_3$ and the like.

Additional minor additives in amounts of from about 0.1 to about 5 weight percent can be added to the composites to additionally improve the electronic properties of the films. These minor additives include oxides such as zirconates, tannates, rare earths, niobates and tantalates. For example, the minor additives may include $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$ and $Ta_2O_3$.

Films of tunable dielectric composites may comprise $Ba_{1-x}Sr_xTiO_3$, in combination with at least one non-tunable dielectric phase selected from MgO, $MgTiO_3$, $MgZrO_3$, $MgSrZrTiO_6$, $Mg_2SiO_4$, $CaSiO_3$, $MgAl_2O_4$, $CaTiO_3$, $Al_2O_3$, SiO2, BaSiO3 and SrSiO3. These compositions can be BSTO and one of these components, or two or more of these components in quantities from 0.25 weight percent to 80 weight percent with BSTO weight ratios of 99.75 weight percent to 20 weight percent.

The electronically tunable materials may also include at least one metal silicate phase. The metal silicates may include metals from Group 2A of the Periodic Table, i.e., Be, Mg, Ca, Sr, Ba and Ra, preferably Mg, Ca, Sr and Ba Preferred metal silicates include Mg2SiO4, CaSiO3, BaSiO3 and SrSiO3. In addition to Group 2A metals, the present metal silicates may include metals from Group 1A (alkalai metals), i.e., Li, Na, K, Rb, Cs and Fr. For example, alkalai metal silicates may include sodium silicates such as Na2SiO3 and NaSiO3-5H2O, and lithium-containing silicates such as LiAlSiO4, Li2SiO3 and Li4SiO4. Metals from Groups 3A, 4A and some transition metals of the Periodic Table may also be suitable constituents of the metal silicate phase. Additional metal silicates may include Al2Si2O7, ZrSiO4, KalSi3O8, NaAlSi3O8, CaAl2Si2O8, CaMgSi2O6, BaTiSi3O9 and Zn2SiO4. The above tunable materials can be tuned at room temperature by controlling an electric field that is applied across the materials.

In addition to the electrically tunable dielectric phase, the electrically tunable materials can include at least two additional metal oxides. The additional metal oxides may include alkalai earth metals from Group 2A of the Periodic Table, i.e.; Mg, Ca, Sr, Ba, Be and Ra The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconates, silicates, titanates, aluminates, stannates, niobates, tantalates and rare earth oxides. Preferred additional metal oxides include MgO, CaO, $ZrO_2$, $Al_2O_3$, $WO_3$, $SnO_2$, $SnO_2$ $Ta_2O_5$, MnO2, PbO, $Bi_2O_3$ and $La_2O_3$ (or any other rare earth oxide) in any concentration Multilayer capacitors with different biasing methods have been described in other patents assigned to Gennum Corporation; U.S. Pat. Nos. 5,745,335 and 6,411,494. These patents are applicable to the multi-layered structures described in this invention.

What is claimed is:

1. A multilayered capacitor, comprising:
    a plurality of voltage tunable dielectric layers including a first voltage tunable dielectric layer with a first density and a first thickness and a second voltage tunable dielectric layer with a second density and a second thickness; and
    one or more electrodes including a common electrode positioned between and shared by the first and second voltage tunable dielectric layers,
    wherein the first and second densities and thicknesses are selected so that a first vibration of said multilayered tunable capacitor caused by an application of a substantially orthogonal RF signal is reduced by a second electro-mechanical vibration generated by one or more bias voltages applied to the first and second tunable dielectric layers via the common electrode, wherein the substantially orthogonal RF signal is applied without applying a substantially lateral RF signal along a length of the common electrode,
    wherein the second electro-mechanical vibration has a phase that differs from a phase of the first electro-mechanical vibration,
    wherein the application of the one or more bias voltages in conjunction with the first and second densities and the first and second thicknesses of the first and second dielectric layers enable generating the first and second electro-mechanical vibrations that substantially cancel each other, and
    wherein the one or more bias voltages are applied to enable a number of the plurality of voltage tunable dielectric layers that are positively biased to equal a number of the plurality of voltage tunable dielectric layers that are negatively biased.

2. The multilayered capacitor of claim 1, wherein the plurality of voltage tunable dielectric layers is an even number of layers, wherein the plurality of electrodes is an odd number of electrodes.

3. The multilayered capacitor of claim 1, wherein the first and second voltage tunable dielectric layers comprise barium strontium titanate, and wherein the common electrode is formed from a metal oxide.

4. The multilayered capacitor of claim 1, wherein the one or more electrodes further comprise two outer electrodes positioned along a top and bottom of the plurality of voltage tunable dielectric layers, wherein the one or more bias voltages are applied to the common electrode and the two outer electrodes to reduce the first vibration.

5. The multilayered capacitor of claim 1, wherein at least one of the plurality of voltage tunable dielectric layers is combined with a non-tunable dielectric material.

6. A device, comprising:
   a bias source for generating one or more bias voltages; and
   a plurality of tunable reactive elements in communication with the bias source, wherein the plurality of tunable reactive elements include first and second tunable reactive elements,
   wherein an orthogonal application of an RF signal to the first and second tunable reactive elements causes a first vibration in the device,
   wherein the first and second tunable reactive elements have densities and thicknesses so that one or more bias voltages applied to portions of the device causes a reduction in the first vibration by generating a second vibration having an opposite phase to the first vibration,
   wherein a plurality of tunable reactive elements is an even number of elements,
   wherein the one or more bias voltages are applied via a plurality of electrodes to enable a number of the plurality of tunable reactive elements that are positively biased to equal a number of the plurality of tunable reactive elements that are negatively biased, and
   wherein the plurality of electrodes is an odd number of electrodes.

7. The device of claim 6, wherein the first and second tunable reactive elements comprise first and second tunable dielectric materials.

8. The device of claim 6, wherein at least one of the plurality of tunable reactive elements comprises non-tunable dielectric material, and wherein the RF signal is applied orthogonally without applying a substantially lateral RF signal along a length of the plurality of tunable reactive elements.

9. The device of claim 6, wherein at least one of the plurality of tunable reactive elements comprises a composition of barium strontium titanate.

10. The device of claim 9, wherein the one or more bias voltages are applied to the plurality of electrodes to reduce the first vibration via a common electrode of the plurality of electrodes positioned between the first and second tunable reactive elements.

11. The device of claim 6, wherein the device corresponds to a tunable reactive matching network, and wherein the tunable reactive matching network has a controllable first vibration according to the application of the one or more bias voltages.

12. The device of claim 11, wherein the tunable reactive matching network has a controllable reactance according to the application of the one or more bias voltages.

* * * * *